US010249376B2

(12) United States Patent
Yeh (10) Patent No.: US 10,249,376 B2
(45) Date of Patent: Apr. 2, 2019

(54) FLASH MEMORY STORAGE DEVICE AND OPERATING METHOD THEREOF

(71) Applicant: Winbond Electronics Corp., Taichung (TW)

(72) Inventor: Jun-Lin Yeh, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/871,107

(22) Filed: Jan. 15, 2018

(65) Prior Publication Data
US 2018/0336954 A1 Nov. 22, 2018

(30) Foreign Application Priority Data
May 16, 2017 (CN) .......................... 2017 1 0342593

(51) Int. Cl.
*G11C 16/34* (2006.01)
*G11C 16/16* (2006.01)
*G11C 16/04* (2006.01)

(52) U.S. Cl.
CPC .......... *G11C 16/3445* (2013.01); *G11C 16/16* (2013.01); *G11C 16/349* (2013.01); *G11C 16/3459* (2013.01); *G11C 16/0483* (2013.01)

(58) Field of Classification Search
CPC . G11C 16/3445; G11C 16/16; G11C 16/3459; G11C 16/349; G11C 16/0483

USPC .......................................... 365/185.09, 185.29
See application file for complete search history.

(56) References Cited

U.S. PATENT DOCUMENTS

| 9,348,748 | B2 | 5/2016 | Chang et al. | |
|---|---|---|---|---|
| 2006/0245253 | A1* | 11/2006 | Hebishima | G11C 16/10 365/185.18 |
| 2015/0279474 | A1* | 10/2015 | Shimura | G11C 11/5642 365/185.2 |

* cited by examiner

*Primary Examiner* — Vu A Le
(74) *Attorney, Agent, or Firm* — JCIPRNET (57) ABSTRACT

A flash memory storage device including a memory cell array and a memory control circuit is provided. The memory cell array includes a plurality of memory blocks and a redundant memory block. The memory blocks are configured to store data. The memory control circuit is coupled to the memory cell array. The memory control circuit is configured to perform an erase operation to a current memory block of the memory blocks and record an erase retry count of the current memory block. The memory control circuit determines whether the erase retry count exceeds a threshold value. If the erase retry count exceeds the threshold value, the memory control circuit replaces the current memory block by the redundant memory block erased in advance during a time interval of the erase operation. In addition, an operating method of a flash memory storage device is also provided.

20 Claims, 5 Drawing Sheets

FLASH MEMORY STORAGE DEVICE AND OPERATING METHOD THEREOF

CROSS-REFERENCE TO RELATED APPLICATION

This application claims the priority benefit of China application serial no. 201710342593.3, filed on May 16, 2017. The entirety of the above-mentioned patent application is hereby incorporated by reference herein and made a part of this specification.

BACKGROUND OF THE INVENTION

1. Field of the Invention

The invention relates to an electronic device and an operating method thereof. More particularly, the invention relates to a flash memory storage device and an operating method thereof.

2. Description of Related Art

For a flash memory storage device, an interface state is easily generated at a drain junction in a cycling operation, and oxide traps are generated in a tunnel oxide layer. Generally, the cycling operation includes an erase operation and a programming operation. A flash memory cell is deteriorated most of the time after repeated cycling operations, for example, reliability of a memory block decreases, or an erase time and a programming time increase, meaning that an operating speed slows down. In addition, after repeated cycling operations, parts of the bits in the cell are not complied with the norms owing to early wearing. The worn bits are difficult to be removed in a testing phase. In existing technologies, one of the solutions is to correct these damaged bits by using error correct bits (ECCs). Nevertheless, said solution often leads to other problems, such as increased chip sizes, lowered operating speeds, or increased power consumption.

SUMMARY OF THE INVENTION

The invention provides a flash memory storage device and an operating method thereof with memory blocks of high reliability and fast operating speeds.

In an embodiment of the invention, a flash memory storage device includes a memory cell array and a memory control circuit. The memory cell array includes a plurality of memory blocks and a redundant memory block. The memory blocks are configured to store data. The memory control circuit is coupled to the memory cell array. The memory control circuit is configured to perform an erase operation to a current memory block of the memory blocks and record an erase retry count of the current memory block. The memory control circuit determines whether the erase retry count exceeds a first threshold value. If the erase retry count exceeds the first threshold value, the memory control circuit replaces the current memory block by the redundant memory block erased in advance during a time interval regulated by the erase operation.

The operating method of the flash memory storage device in an embodiment of the invention includes performing the erase operation to the current memory block of the memory blocks and recording the erase retry count of the current memory block; determining whether the erase retry count exceeds the first threshold value; and replacing the current memory block by the redundant memory block erased in advance during the time interval regulated by the erase operation if the erase retry count exceeds the first threshold value.

In view of the foregoing, in the flash memory storage device and the operating method thereof provided by the embodiments of the invention, in the time interval of the erase operation, the memory block fails to be complied with the norms is replaced by the redundant memory block erased in advance, so as to perform the erase operation and thereby enhance memory block reliability and operating speeds.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Herein, several embodiments of the invention are introduced to describe the invention; however the invention is not limited by the embodiments. Suitable combinations among the embodiments are also allowed. The term "coupled to" used throughout the embodiments (including claims) may refer to any direct and indirect connection means. For example, if a first device is described as being coupled to a second device in the embodiments, the sentence should be explained as the first device may be connected to the second device directly, or the first device may, through any other device or through certain connection means, be connected to the second device indirectly.

Figure 1:
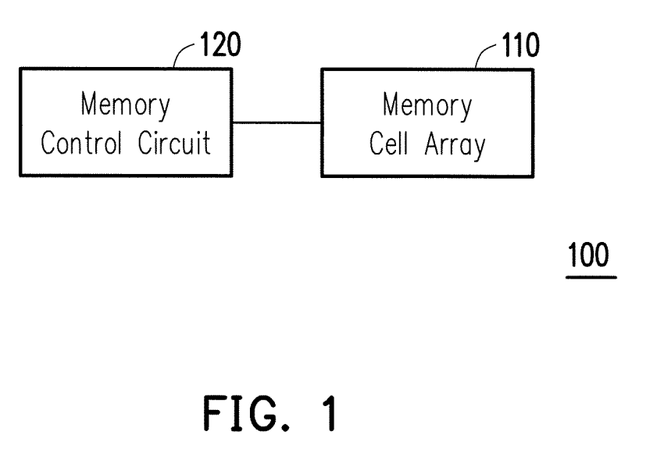
FIG. 1 is a schematic diagram illustrating a flash memory storage device according to an embodiment of the invention.
Figure 2:
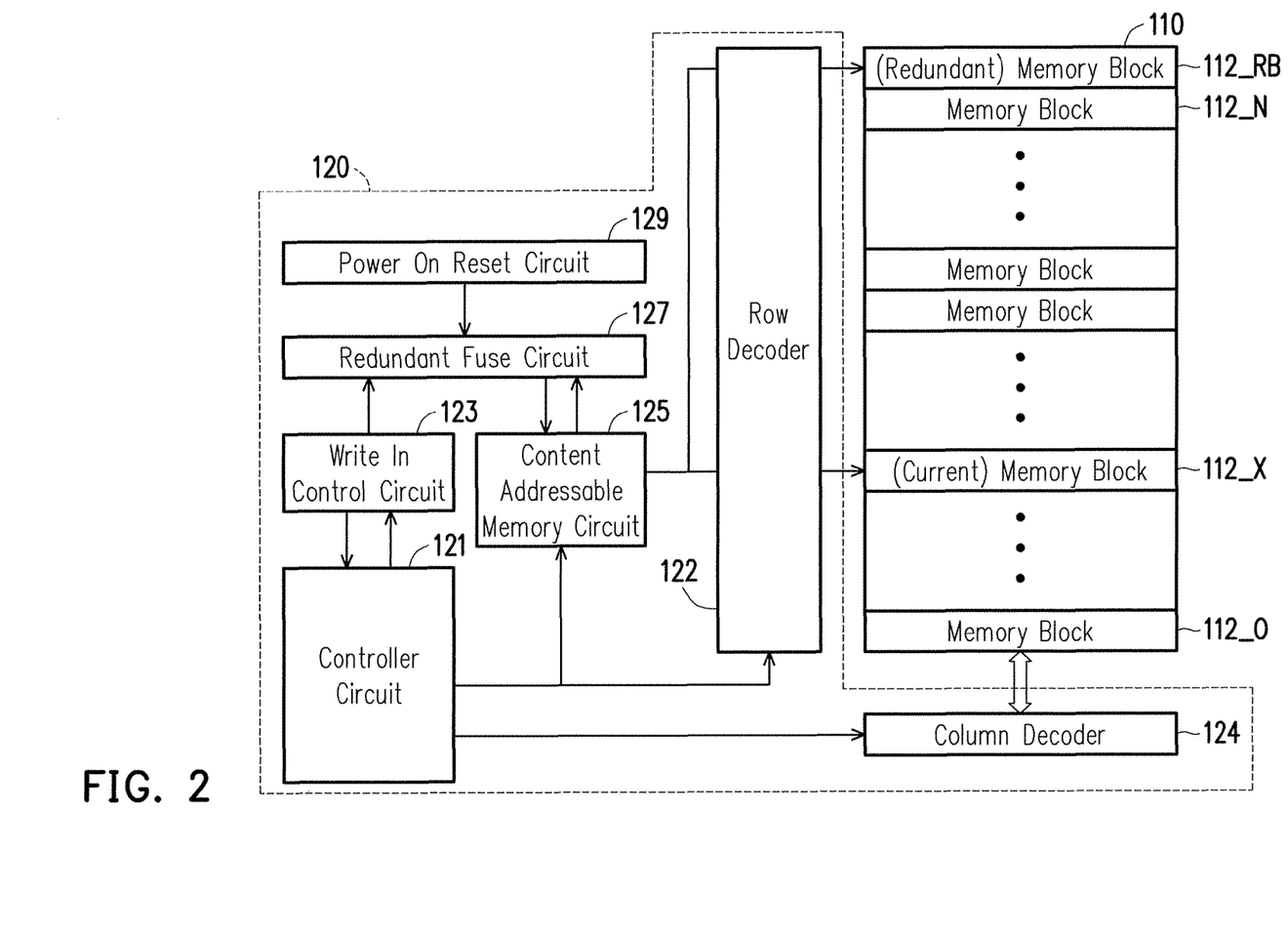
FIG. 2 is an internal block diagram illustrating the flash memory storage device of FIG. 1.

FIG. 1 is a schematic diagram illustrating a flash memory storage device according to an embodiment of the invention. FIG. 2 is an internal block diagram illustrating the flash memory storage device of FIG. 1. Referring to FIG. 1 and FIG. 2, a flash memory storage device 100 provided by the present embodiment includes a memory cell array 110 and a memory control circuit 120. The memory control circuit 120 is coupled to the memory cell array 110. The memory cell array 110 includes a plurality of memory blocks 112_0 to 112_N and a redundant memory block 112_RB, and N is a positive integer greater than 0. In an embodiment, N is, for example, equal to 255, meaning that the memory cell array 110 includes 256 memory blocks. Nevertheless, a number of the memory blocks is not be construed as limitations of the invention. In the present embodiment, a number of the redundant memory block is exemplified as one; nevertheless, the number of the redundant memory block is not be construed as limitations of the invention. In an embodiment, the number of the redundant memory block included in the memory cell array 110 can be plural.

In the present embodiment, the memory blocks 112_0 to 112_N are configured to store data. When an erase retry count and/or a soft programming retry count of any one memory block of the memory blocks 112_0 to 112_N is greater than a preset threshold value, the redundant memory block 112_RB erased in advance is configured to replace said any one memory block. In FIG. 2, a current memory block 112_X is, for example, configured to represent said any one memory block of the memory blocks 112_0 to 112_N, and X is a positive integer greater than or equal to 0 and less than or equal to 255.

In the present embodiment, the memory control circuit 120 includes a controller circuit 121, a write in control logic circuit 123, a content addressable memory (CAM) circuit 125, a redundant fuse circuit 127, a power on reset (POR) circuit 129, a row decoder 122, and a column decoder 124. In an embodiment, the memory control circuit 120 may include, for example, a status register circuit, a high voltage generator circuit, a page address latch/counter circuit, a byte address latch/counter circuit, and other suitable circuits configured to collaboratively control data access. The invention is not limited thereto. In the embodiments of the invention, various circuits of the memory control circuit 120 may respectively be implemented by any one of suitable circuit structures in the art, and the invention is not limited thereto. People having ordinary skill in the art may acquire sufficient teachings, suggestions, and other details related to the circuit structures and operating methods.

In the present embodiment, the memory control circuit 120 is, for example, configured to control an overall operation of the flash memory storage device 100, for example, including an erase operation and/or a soft programming operation, to access stored data in the memory blocks. For instance, the controller circuit 121 is, for example, configured to control the row decoder 122 and the column decoder 124 to select the memory blocks of the data to be accessed. The controller circuit 121 is, for example, configured to control the write in control logic circuit 123 to perform the erase operation and/or the soft programming operation to the memory blocks.

In the present embodiment, non-volatile memory cells (e.g., fuses) of the redundant fuse circuit 127 are configured to record a repair address ADS_R. The repair address ADS_R is, for example, an address of the current memory block 112_X about to be replaced. In a power up moment, the repair address ADS_R is loaded from the redundant fuse circuit 127 to the content addressable memory circuit 125. On the other hand, the control circuit 121 transmits a block address ADS_B to perform the erase operation and/or the soft programming operation to the content addressable memory circuit 125. When the repair address ADS_R stored in the content addressable memory circuit 125 and the block address ADS_B inputted from the controller circuit 121 are matched, the redundant memory block 112_RB is enabled and can be used to replace any one of the memory blocks, for example, the current memory block 112_X about to be replaced. In the present embodiment, the write in control logic circuit 123 or the power on reset circuit 129 is configured to power up the content addressable memory circuit 125. The content addressable memory circuit 125 makes a comparison between the repair address ADS_R and the block address ADS_B. If the two are matched, the content addressable memory circuit 125 enables the redundant memory block 112_RB and disables, e.g., the current memory block 112_X, so as to replace the current memory block 112_X by the redundant memory block 112_RB erased in advance.

In the present embodiment, the flash memory storage device 100 may be, for example, a NAND type flash memory storage device or a NOR type flash memory storage device. In the present embodiment, whether the flash memory storage device 100 is the NAND type flash memory storage device or the NOR type flash memory storage device, a cycling operation is performed based on a block.

In one embodiment, the memory blocks in the memory blocks 112_0 to 112_N need to be replaced may be plural, and thereby, the memory cell array 110 may include numerous redundant memory blocks to be configured to replace the corresponding memory blocks. For the operation method, enough teaching, suggestion, and implementation illustration are obtained from the above embodiments of FIG. 1 to FIG. 2, and that detailed descriptions are not further provided hereinafter.

Figure 3:
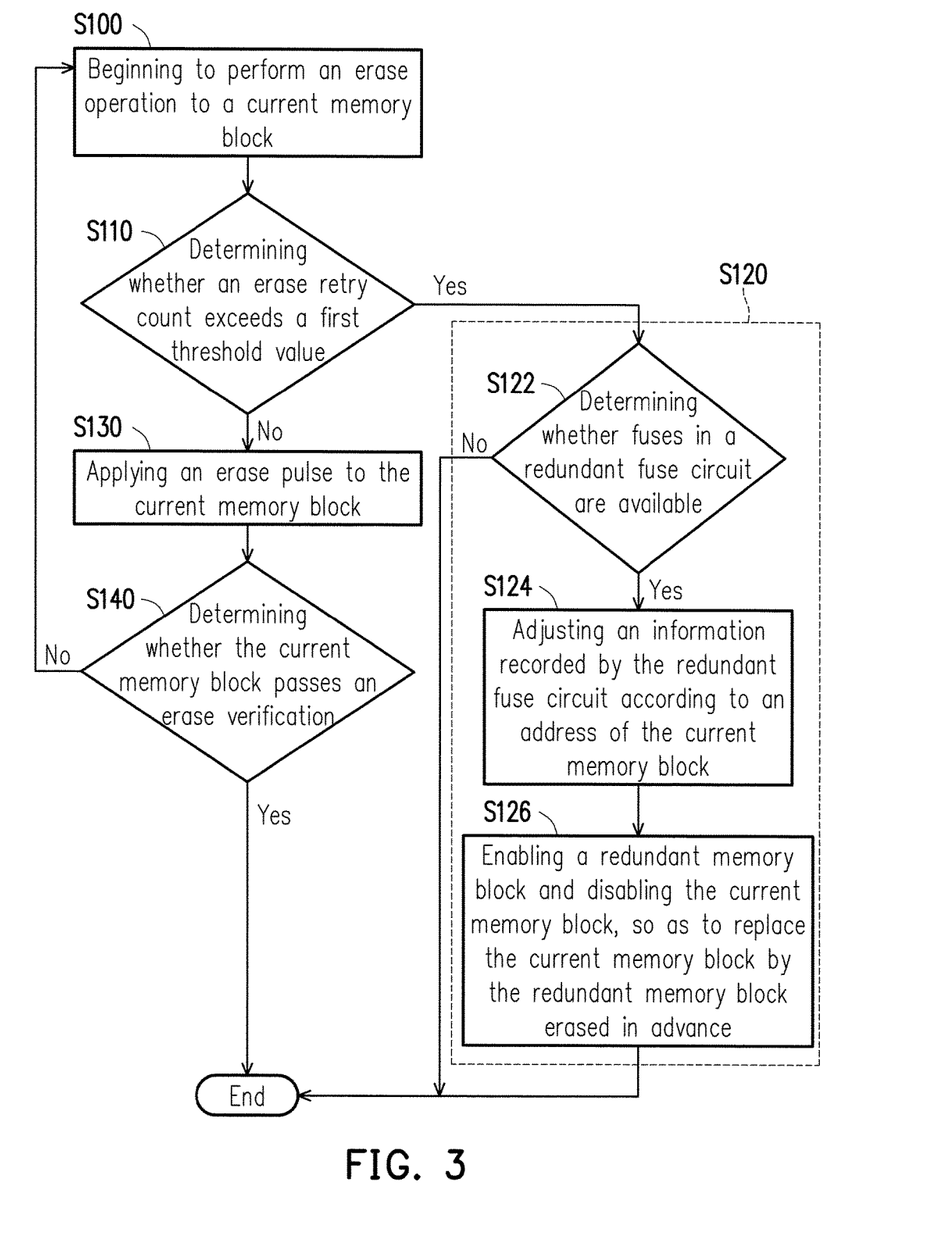
FIG. 3 is a flowchart illustrating steps of an operating method of a flash memory storage device according to an embodiment of the invention.

FIG. 3 is a flowchart illustrating steps of an operating method of a flash memory storage device according to an embodiment of the invention. The operation method of the embodiment is, for example, suitable for the NAND type flash memory storage device. Referring to FIG. 1 to FIG. 3, in step S100, the memory control circuit 120 begins to perform the erase operation to the designated memory block after receiving a block erasing command. In the step, the memory control circuit 120 performs the erase operation to the current memory block 112_X of the memory blocks 1120 to 112_N and records an erase retry count α of the current memory block 112_X. In step S110, the memory control circuit 120 determines whether the erase retry count α exceeds a first threshold value T1.

In the present embodiment, if the control memory circuit 120 determines that the erase retry count α exceeds the first threshold value T1, the memory control circuit 120 executes step S120 during a time interval of the erase operation, so as to replace the current memory block 112_X by the redundant memory block 112_RB. In the present embodiment, step S120 includes step S112, step S124, and step S126. In step S122, the memory control circuit 120 determines whether fuses in the redundant fuse circuit 127 are available. In the present embodiment, whether the fuses are available refers to that, for example, whether fuses for status adjustment exist in the redundant fuse circuit 127, so as to write the address of the memory block into the redundant fuse circuit 127.

If the memory control circuit 120 determines that the fuses in the redundant fuse circuit 127 are available, in step S124, the memory control circuit 120 adjusts an information recorded by the redundant fuse circuit 127 according to the address of the current memory block 122_X, for example, writing the address of the current memory block 122_X into the redundant fuse circuit 127 when the address of the current memory block 122_X acts as the repair address. In step S126, the memory control circuit 120 enables the redundant memory block 112_RB and disables the current memory block 112_X, so as to replace the current memory block 112_X by the redundant memory block 112_RB. In the step, the memory control circuit 120 reads the address of the current memory block 112_X in the redundant fuse circuit 127, so as to load the address into the content addressable memory circuit 125 and end the erase operation to the current memory block 112_X. If the memory control circuit 120 determines that the fuses in the redundant fuse circuit 127 are unavailable, the memory control circuit 120 ends the erase operation.

In the present embodiment, if the memory control circuit 120 determines that the erase retry count α does not exceed the first threshold value T1, the memory control circuit 120 executes step S130. In step S130, an erase pulse is applied to the current memory block 112_X to erase a data stored within. In step S140, the memory control circuit 120 determines whether the current memory block 112_X passes an erase verification. In the present embodiment, if the current memory block 112_X passes the erase verification, the memory control circuit 120 ends the erase operation. If the current memory block 112_X does not pass the erase verification, the memory control circuit 120 executes step S100 and step S110 to re-determine whether the determined erase retry count α of the current memory block 112_X exceeds the first threshold value T1.

In addition, for the operating method of the flash memory storage device provided by the embodiments of the invention, enough teaching, suggestion, and implementation illustration are obtained from the above embodiments of FIG. 1 to FIG. 2, and that detailed descriptions are not further provided hereinafter.

Figure 4A:
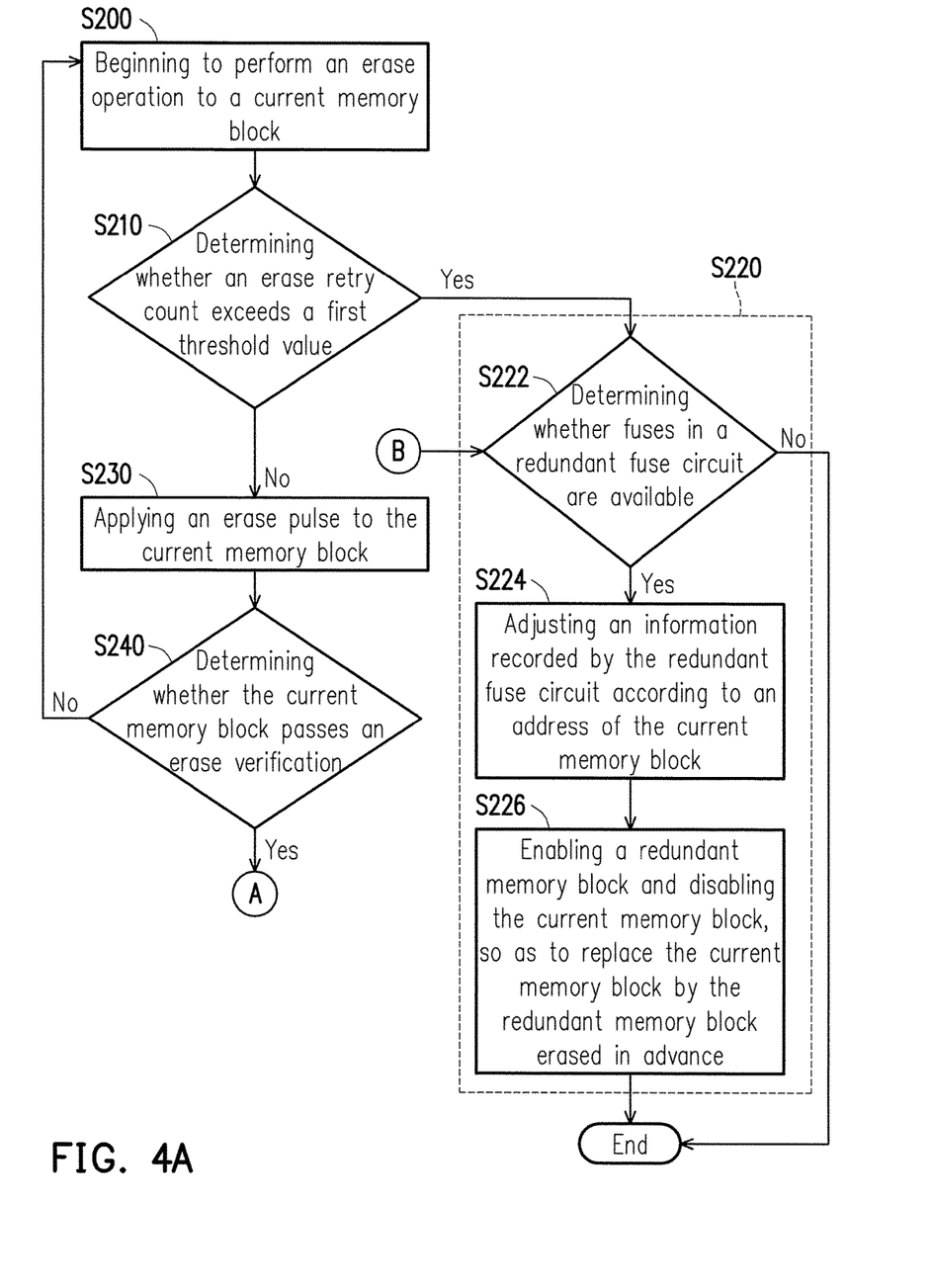
FIG. 4A and FIG. 4B are a flowchart illustrating steps of an operating method of a flash memory storage device according to another embodiment of the invention.
Figure 4B:
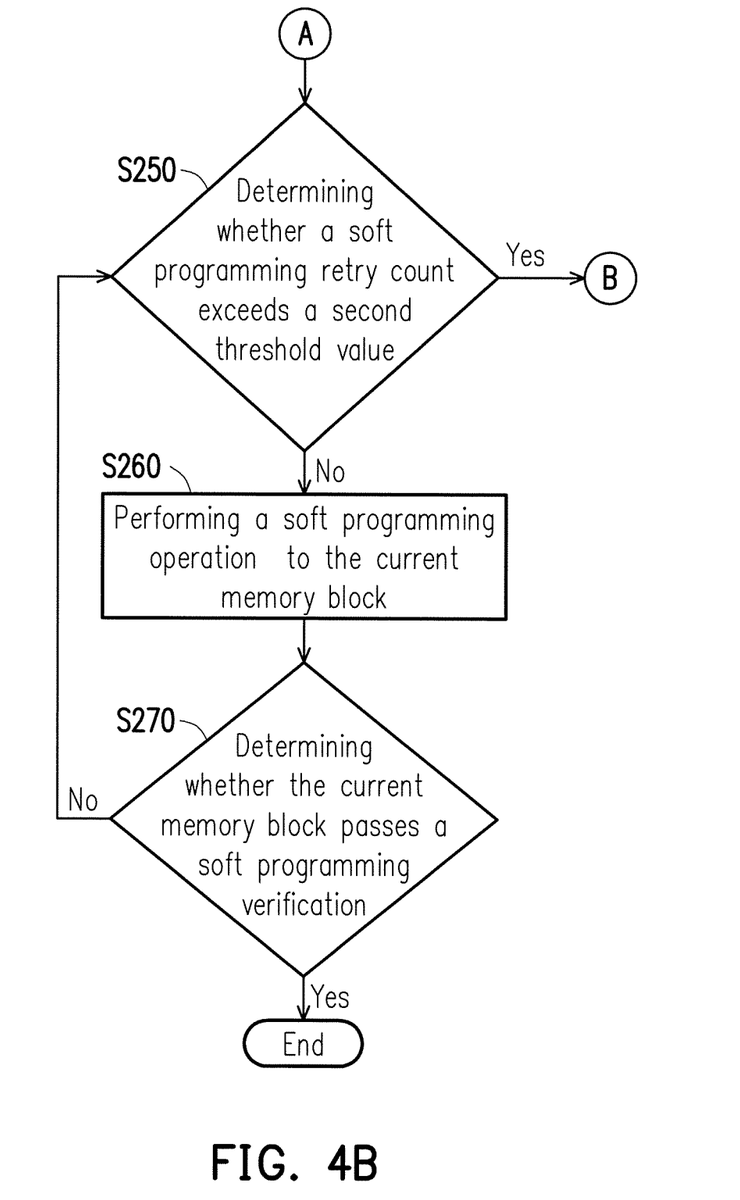

FIG. 4A and FIG. 4B are a flowchart illustrating steps of an operating method of a flash memory storage device according to another embodiment of the invention. The operation method of the present embodiment is, for example, suitable for the NOR type flash memory storage device. Referring to FIG. 1 to FIG. 4B, the operating method of the flash memory storage device provided by the present embodiment is similar to that of the embodiment of FIG. 3, while differences therebetween include that the operating method of the embodiment of FIG. 4A and FIG. 4B determines whether to replace the current memory block 112_X by the redundant memory block 112_RB according further to whether a soft programming retry count β exceeds a second threshold value T2. Thereby, in the present embodiment, the two parameter values used to determine whether to replace the current memory block 112_X by the redundant memory block 112_RB include the erase retry count α and the soft programming retry count β.

Specifically, in step S240, if the current memory block 112_X passes the erase verification, the memory control circuit 120 executes step S250. In step S250, the memory control circuit 120 determines whether the soft programming retry count β exceeds the second threshold value T2. In the present embodiment, the second threshold value T2 may be similar to or different from the first threshold value T1, and the invention is not limited thereto. In step S220, if the control memory circuit 120 determines that the soft programming retry count β exceeds the second threshold value T2, the memory control circuit 120 executes step S220 during a time interval of the soft programming operation, so as to replace the current memory block 112_X by the redundant memory block 112_RB. In step S222, if the memory control circuit 120 determines that the fuses in the redundant fuse circuit 127 are unavailable, the memory control circuit 120 ends the soft programming operation.

In the present embodiment, if the memory control circuit 120 determines that the soft programming retry count β does not exceed the second threshold value T2, the memory control circuit 120 executes step S260. In step S260, the memory control circuit 120 performs the soft programming operation to the current memory block 112_X. In step S270, the memory control circuit 120 determines whether the current memory block 112_X passes a soft programming verification. In the present embodiment, if the current memory block 112_X passes the soft programming verification, the memory control circuit 120 ends the soft programming operation. If the current memory block 112_X does not pass the soft programming verification, the memory control circuit 120 returns to step S250 to re-determine whether the determined soft programming retry count β of the memory block 112_X exceeds the second threshold value T2.

In the present embodiment, the soft programming operation is, for example, applying a soft programming voltage less than a voltage applied in a general programming operation to the word line in the block, so as to provide a power for injecting electronic charges into the memory cell to enable an activating voltage to move forward toward a direction of positive value. As the soft programming voltage is less than the general programming voltage, and thus, the electronic charges are relatively easy to be injected to the erased memory cell, and the electronic charges are relatively less easy to be injected into the memory cell with the threshold voltage close to an upper limit value. People having ordinary skill in the art may acquire sufficient teachings, suggestions, and other details related to the soft programming operation of the present embodiment.

In addition, for the operating method of the flash memory storage device provided by the embodiments of the invention, enough teaching, suggestion, and implementation illustration are obtained from the above embodiments of FIG. 1 to FIG. 3, and that detailed descriptions are not further provided hereinafter.

In view of the foregoing, in the embodiments of the invention, the memory control circuit determines whether to replace the deteriorated memory block undergoing repeated erase operations and/or the soft programming operations by the redundant memory block erased in advance according to the erase retry count and/or the soft programming retry count. Thereby, after the deteriorated memory block is replaced by the redundant memory block, reliability of the memory blocks is enhanced. In addition, in the embodiments of the invention, the operation of the memory control circuit to replace the deteriorated memory block by the redundant memory block is performed in the time interval of the erase operation and/or the soft programming operation, rather than being performed in the testing phase of the flash memory storage device before shipping. After the deteriorated memory block is replaced, the flash memory storage device is thus not to be affected by the interface state generated at the drain junction after repeated cycling operations or the oxide traps in the tunnel oxide layer, and operating speeds can thereby be increased compared to existing technology.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory storage device, comprising:
a memory cell array, comprising a plurality of memory blocks and a redundant memory block, wherein the memory blocks are configured to store data; and
a memory control circuit, coupled to the memory cell array and configured to perform an erase operation to a current memory block of the memory blocks and record an erase retry count of the current memory block;
wherein the memory control circuit determines whether the erase retry count exceeds a first threshold value, and the memory control circuit replaces the current memory block by the redundant memory block erased in advance during a time interval of the erase operation if the erase retry count exceeds the first threshold value.

2. The flash memory storage device as claimed in claim 1, wherein the memory control circuit is further configured to perform a soft programming operation to the current memory block and record a soft programming retry count of the current memory block, wherein the memory control circuit determines whether the soft programming retry count exceeds a second threshold value, and the memory control circuit replaces the current memory block by the redundant memory block during a time interval of the soft programming operation f the soft programming retry count exceeds the second threshold value.

3. The flash memory storage device as claimed in claim 2, wherein the memory control circuit comprises:
a redundant fuse circuit, configured to record a repair address, wherein the repair address corresponds to an address of the current memory block to be replaced.

4. The flash memory storage device as claimed in claim 3, wherein the memory control circuit further comprises a controller circuit and a content addressable memory circuit, and the controller circuit is configured to transmit the address of the current memory block to the content addressable memory circuit.

5. The flash memory storage device as claimed in claim 4, wherein in a power up moment, the repair address is loaded from the redundant fuse circuit to the content addressable memory circuit, and the content addressable memory circuit is configured to make a comparison to determine whether the repair address and the address of the current memory block are matched.

6. The flash memory storage device as claimed in claim 5, wherein the redundant memory block is enabled and is configured to replace the current memory block when the repair address and the address of the current memory block are matched.

7. The flash memory storage device as claimed in claim 5, wherein the memory control circuit further comprises a write in control logic circuit and a power on reset circuit, and one of the write in control logic circuit and the power on reset circuit is configured to power up the content addressable memory circuit in the power up moment.

8. The flash memory storage device as claimed in claim 7, wherein the controller circuit is configured to control the write in control logic circuit to perform the erase operation and/or the soft programming operation to the memory blocks.

9. An operating method of a flash memory storage device, wherein the flash memory storage device comprises a plurality of memory blocks and a redundant memory block, the memory blocks are configured to store data, and the operating method comprises:
performing an erase operation to a current memory block of the memory blocks and recording an erase retry count of the current memory block;
determining whether the erase retry count exceeds a first threshold value; and
replacing the current memory block by the redundant memory block erased in advance during a time interval of the erase operation if the erase retry count exceeds the first threshold value.

10. The operating method of the flash memory storage device as claimed in claim 9, wherein the step of replacing the current memory block by the redundant memory block comprises:
determining whether fuses in a redundant fuse circuit are available; and
adjusting an information recorded by the redundant fuse circuit according to an address of the current memory block if the fuses in the redundant fuse circuit are available.

11. The operating method of the flash memory storage device as claimed in claim 10, wherein the step of replacing the current memory block by the redundant memory block further comprising:
ending the step of replacing the current memory block by the redundant memory block if the fuses in the redundant fuse circuit are determined to be unavailable.

12. The operating method of the flash memory storage device as claimed in claim 9, further comprising:
performing the erase operation to the current memory block if the erase retry count does not exceed the first threshold value; and
determining whether the current memory block passes an erase verification.

13. The operating method of the flash memory storage device as claimed in claim 12, further comprising:
re-determining whether the erase retry count exceeds the first threshold value if the current memory block does not pass the erase verification.

14. The operating method of the flash memory storage device as claimed in claim 12, further comprising:
ending the erase operation if the current memory block passes the erase verification.

15. The operating method of the flash memory storage device as claimed in claim 12, further comprising:
performing a soft programming operation to the current memory block and recording a soft programming retry count of the current memory block if the current memory block passes the erase verification;
determining whether the soft programing retry count exceeds a second threshold value; and
replacing the current memory block by the redundant memory block during a time interval of the soft programming operation if the soft programming retry count exceeds the second threshold value.

16. The operating method of the flash memory storage device as claimed in claim 15, wherein the step of replacing the current memory block by the redundant memory block comprises:
determining whether the fuses in the redundant fuse circuit are available; and
adjusting the information recorded by the redundant fuse circuit according to the address of the current memory block if the memory control circuit determines that the fuses in the redundant fuse circuit are available.

17. The operating method of the flash memory storage device as claimed in claim 16, wherein the step of replacing the current memory block by the redundant memory block further comprising:
ending the operation of replacing the current memory block by the redundant memory block if the fuses in the redundant fuse circuit are unavailable.

18. The operating method of the flash memory storage device as claimed in claim 15, further comprising:
performing the soft programming operation to the current memory block if the soft programming retry count does not exceed the second threshold value; and
determining whether the current memory block passes a soft programming verification.

19. The operating method of the flash memory storage device as claimed in claim 18, further comprising:

re-determining whether the soft programming retry count exceeds the second threshold value if the current memory block does not pass the soft programming verification.

20. The operating method of the flash memory storage device as claimed in claim 18, further comprising:
ending the soft programming operation if the current memory block passes the soft programming verification.

* * * * *